US006313667B1

(12) United States Patent
Eschauzier (10) Patent No.: US 6,313,667 B1
(45) Date of Patent: Nov. 6, 2001

(54) APPARATUS AND METHOD FOR A TURN AROUND STAGE HAVING REDUCED POWER CONSUMPTION, CLASS AB BEHAVIOR, LOW NOISE AND LOW OFFSET

(75) Inventor: Rudolphe Gustave Hubertus Eschauzier, Bergschenhoek (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/704,474

(22) Filed: Nov. 1, 2000

(51) Int. Cl.$^7$ ...................................................... H03K 5/22
(52) U.S. Cl. ............................................... 327/65; 330/261
(58) Field of Search .................................. 327/63, 65, 77, 327/89, 560–563, 52, 53, 55, 478; 330/252, 253, 258, 261

(56) References Cited

U.S. PATENT DOCUMENTS

| | | | |
|---|---|---|---|
| 4,532,479 | 7/1985 | Blauschild | 330/261 |
| 4,634,897 | * 1/1987 | Yoshioka | 327/65 |
| 5,077,489 | * 12/1991 | Gola et al. | 327/63 |
| 5,254,956 | * 10/1993 | Nishijima | 330/258 |
| 5,610,557 | * 3/1997 | Jett, Jr. | 330/261 |
| 6,060,912 | * 5/2000 | Opris et al. | 327/65 |
| 6,229,394 | * 5/2001 | Harvey | 330/252 |

OTHER PUBLICATIONS

"2.7V, 800 μA, 80MHz, Rail-to-Rail I/O Amplifiers", DataSheet AD8031/AD8032, Analog Devices, Inc., 1999.

* cited by examiner

Primary Examiner—Toan Tran
(74) Attorney, Agent, or Firm—Merchant & Gould P.C.; John W. Branch (57) ABSTRACT

The invention includes a differential input stage that is coupled to a turn around stage with a differential output. The input common mode voltage range is independent of the output common mode voltage range and the electronic circuitry is suited for use with other circuits such as an amplifier. The circuitry provides Class AB operation with quiescent and bias currents that are significantly less than the maximum output signal current so that overall power consumption is significantly reduced. The biasing of the output transistors in the turn around stage is floated and the invention is well suited for use with other circuits that require an input stage that can operate between the rails of a voltage supply. Also, the amount of noise is reduced and the offset performance of the circuit is improved by cross coupling the emitters of separate transistors employed to bias the output transistors in the turn around stage. Additionally, a complementary input stage can receive a differential input signal with a common mode voltage that is at, or between, the rails of the voltage supply. Further, a pair of turn around stages are adapted to combine the currents outputted by the complementary input stage.

21 Claims, 8 Drawing Sheets

APPARATUS AND METHOD FOR A TURN AROUND STAGE HAVING REDUCED POWER CONSUMPTION, CLASS AB BEHAVIOR, LOW NOISE AND LOW OFFSET

FIELD OF THE INVENTION

The present invention relates to the field of amplifiers, and in particular, to a turn around stage with Class AB behavior, low power consumption, low noise and improved offset performance.

BACKGROUND OF THE INVENTION

An integrated amplifier circuit such as an opamp is usually constructed from a small chip of semiconductor material upon which an array of active/passive components have been constructed and connected together to form a functioning circuit. An integrated amplifier circuit is generally encapsulated in a plastic housing (chip) with signal, power supply, and control pins accessible for connection to external electronic circuitry. Typically, input signals transmitted to the integrated amplifier circuit via selected input pins are processed by active and passive components in different stages, e.g., input and turn-around, and the processed signals are then applied to selected output pins using an output stage.

The enormous growth of high-speed communication and high data rate image processing applications, requiring high-speed, low power and small size, has created a demand for miniaturized high-speed amplifiers that can operate at low voltages. To maximize the dynamic range at low supply voltages for this use, it is desirable that the output voltage range for this type of amplifier should be as large as possible. Preferably, the output voltage range of the amplifier would extend from one rail to the other rail of the power supply.

Class-AB circuitry is used in amplifiers that employ both bipolar and MOS components. A Class AB circuit can deliver to and pull from a load a current that is larger than the DC quiescent current flowing into the circuit. Class AB circuitry is preferred in output stage of a low-power high speed amplifier because it improves power efficiency by maximizing the output drive current with a relatively low quiescent current. For example, the drive current for a Class AB circuit might be 100 milliamps and the quiescent current could be 1 milliamps. Also, Class AB circuitry exhibits good linearity over the entire output voltage range.

A turn around or level-shift stage is an often neglected, but crucial part of an amplifier. Its main purpose is providing a level shift function, such that the input common mode voltage range of the amplifier is independent of the output voltage. Because the turn around stage often directly follows an input stage, the turn around stage is usually an important contributor to input non-ideal parameters such as offset and noise. In many cases, the turn around stage can be the dominant factor for these parameters, and sometimes even more so than the input stage itself.

SUMMARY OF THE INVENTION

In accordance with the invention, an apparatus for a circuit with an input common mode voltage range that is independent of the output voltage range is disclosed. An input stage is adapted for receiving an input signal. A first current source is coupled to an emitter of a first transistor and an emitter of a second transistor. A current provided by the first current source is evenly split between the emitters of the first and second transistors when a polarity of the input signal is equal. Alternatively, when one of the first and second transistors is activated by an unequal polarity of the input signal and the other of the first and second transistors is deactivated, the current provided by the first current source flows mainly through one of the first and second transistors that is activated. A turn around stage outputs an output signal when the polarity of the input signal is unequal. A second current source is coupled to a collector of a third transistor and a third current source is coupled to a collector of a fourth transistor. The flow of the current through the one of the first and second switches that is activated causes one of the third and fourth switches to be deactivated and another one of the third and fourth switches to be activated. The one of the third and fourth transistors that is activated conducts an output current from one of the second and third current sources that is substantially larger than another current that flows through the other one of the third and fourth switches that is deactivated. A bias circuit separately provides a floating bias for the operation of the third and fourth transistors. A base and a collector of a fifth transistor is coupled to a base of the third transistor. A fourth current source and an emitter of the fifth transistor is cross coupled to an emitter of the fourth transistor. A base and a collector of a sixth transistor is coupled to a base of the fourth transistor. The fourth current source and an emitter of the sixth transistor is cross coupled to an emitter of the third transistor.

In accordance with another aspect of the invention, a first resistor is coupled between the fourth current source and the base and the collector of the fifth transistor. Also, a second resistor is coupled between the fourth current source and the base and the collector of the sixth transistor. A value of the first resistor and another value of the second transistor are matched so that a total current provided by the fourth current source is split evenly between a current that flows through the fifth transistor and another current that flows through the sixth transistor. It is further envisioned that the difference between the value of the first resistor and the other value of the second transistor is less than a tenth of a percent. The cross coupling of the emitters of the fifth and sixth transistors and the arrangement of the first and second resistors reduces noise, offset and power consumption of the circuit.

In accordance with yet another aspect of the invention, the first and second transistors are PNP bipolar transistors, the third and fourth transistors are NPN bipolar transistors and the fifth and sixth transistors are NPN bipolar transistors. Also, each current flowing through the fifth and sixth transistors are equal and constant both when the polarity of the input signal is equal and when the polarity of the input signal is unequal.

In accordance with still another aspect of the invention, a third resistor has one end coupled to a negative rail of a voltage supply and another end coupled to the collector of the first transistor, the emitter of the third transistor and the emitter of the fifth transistor. Also, a fourth resistor has one end coupled to the negative rail of the voltage supply and another end coupled to the collector of the first transistor, the emitter of the fourth transistor and the emitter of the sixth transistor, so that a current flowing through the third resistor matches another current flowing through the fourth resistor. Additionally, a fifth resistor has one end coupled to the first current source and another end coupled to the emitter of the first transistor. A sixth resistor has one end coupled the first current source and another end coupled to the emitter of the second transistor.

In accordance with another aspect of the invention, the output current that flows through the one of the third and fourth transistors that is activated is substantially equal to the current that flows through the one of the first and second transistors that is activated by the unequal polarity of the input signal. The first, second, third and fourth current sources are coupled to a positive rail of a voltage supply. Also, the first, second, third and fourth current sources include at least one resistor and at least one transistor. Additionally, the invention provides Class AB behavior.

In accordance with yet another aspect of the invention, the input signal is received across a base of the first transistor and a base of the second transistor. Also, the output signal is provided across the collectors of the third and fourth transistors.

In accordance with further aspects of the invention, a complementary input stage is adapted to receive a differential input signal with a common mode voltage that can be at, or between, the rails of a voltage supply. Also, a pair of turn around stages are adapted to combine the currents outputted by the complementary input stage.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The invention includes a differential input stage that is coupled to a turn around stage with a differential output. The input common mode voltage range is independent of the output voltage range and the electronic circuitry is suited for use with other circuits such as an amplifier. The circuitry provides Class AB operation with quiescent and bias currents that are significantly less than the maximum output signal current so that overall power consumption is significantly reduced. The biasing of the output transistors in the turn around stage is floated and the invention is suited for use with other circuits that require an input stage that can operate between the rails of a voltage supply. Also, the amount of noise and power consumption is reduced and the offset performance of the circuit is improved by cross coupling the emitters of the separate transistors employed to bias the output transistors in the turn around stage and the arrangement of separate resistors between separate current sources and the biasing transistors.

Figure 1:
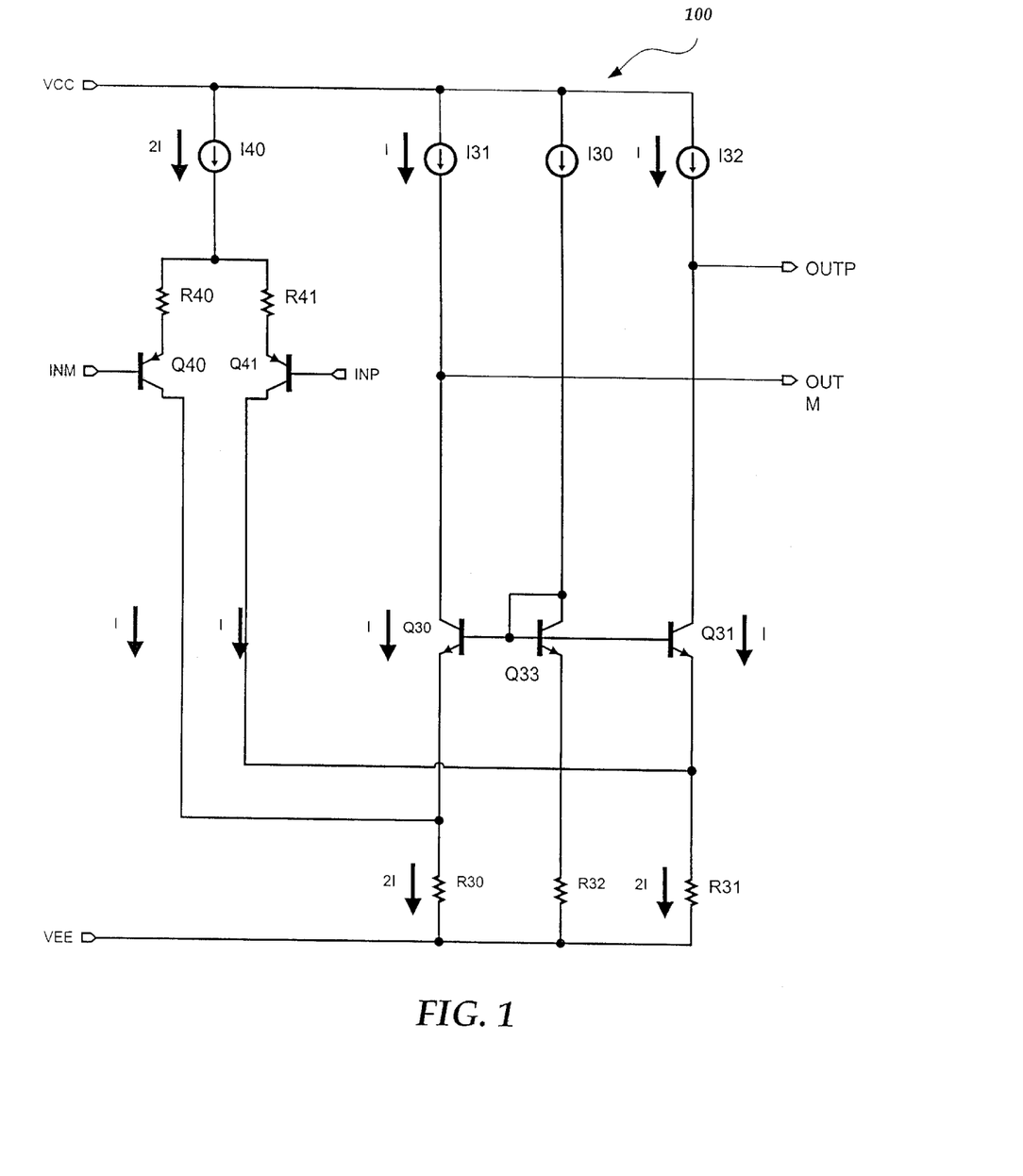
FIG. 1 illustrates a schematic diagram of an electronic circuit with a turn around stage that is referenced to ground.

FIG. 1 shows a schematic diagram of an electronic circuit 100 at rest that includes an input stage coupled to a turn around stage. The input stage is represented by the arrangement of a pair of bipolar PNP input transistors Q40 and Q41 whose emitters are separately coupled through a pair of resistors R40 and R41 to a current source I40, which is coupled to the high side of the supply voltage VCC. Also, the collectors of input transistors Q40 and Q41 are separately coupled to the emitters of bipolar NPN output transistors Q30 and Q31, respectively. A pair of differential input terminals INM and INP are coupled to the bases of input transistors Q40 and Q41, respectively.

The turn around stage is created by the arrangement of output transistors Q30 and Q31 in a cascade configuration. A bipolar NPN bias transistor Q33 and a resistor R32 are employed to bias the operation of output transistors Q30 and Q31. Also, since the base-emitter voltage of bias transistor Q33 cancels the base-emitter voltages of output transistors Q30 and Q31, the voltage drop across resistors R30 and R31 is substantially similar to the voltage drop across resistor R32.

Values for an amount of current is represented by the character "I" in the figures discussed here and below. For biasing, a pair of current sources I31 and I32 provide separate currents to each output transistor that is half the value ("I") of another current ("2I") provided by a current source I40 coupled to both of the input transistors. In this way, when the input stage is driven so hard that the all of the current ("2I") from current source I40 mainly flows through only one of the input transistors, i.e., Q40 or Q41, neither of the output transistors Q30 or Q31 will be turned completely off.

Figure 2:
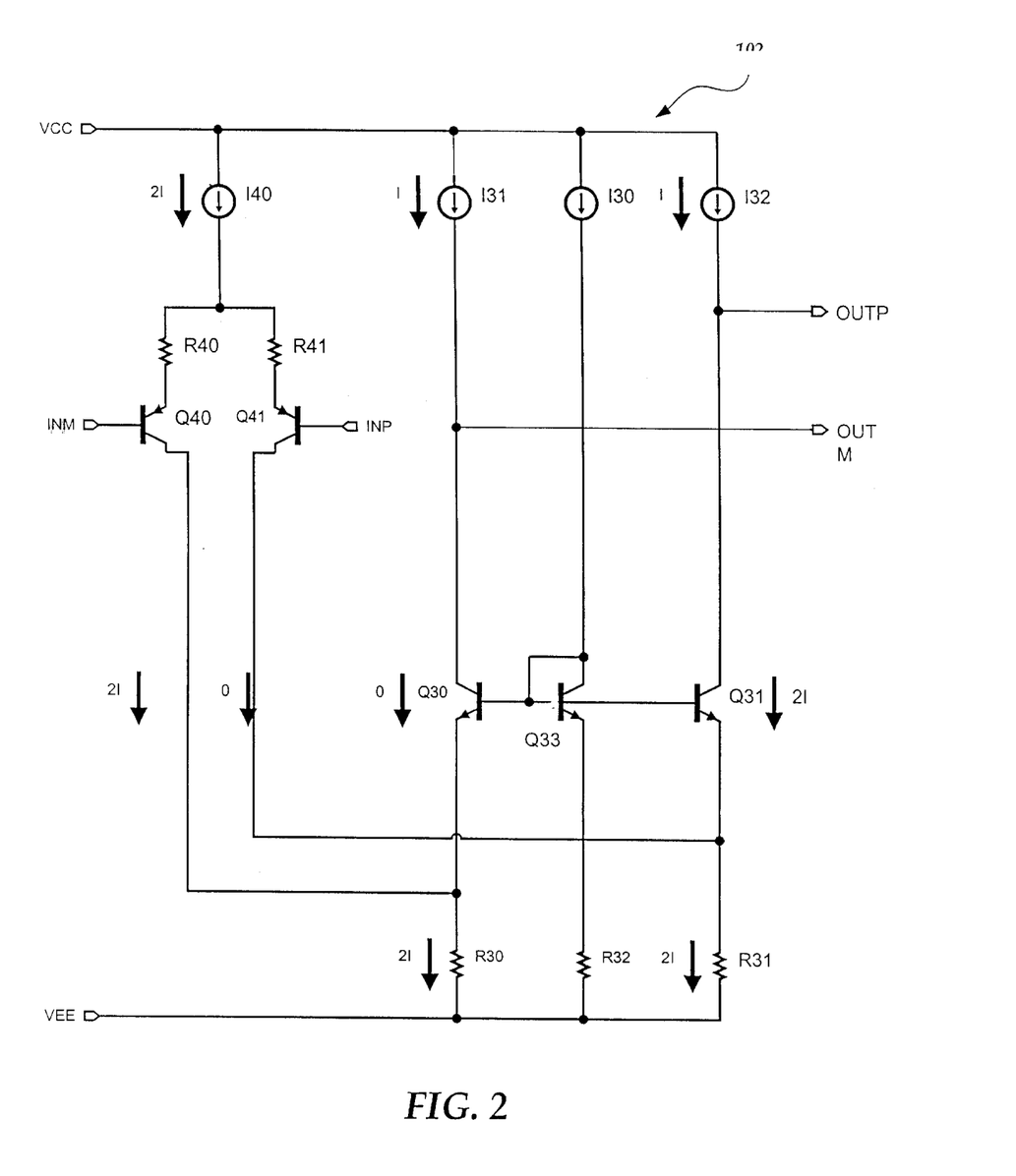
FIG. 2 shows another schematic diagram of the electronic circuit with the turn around stage that is referenced to ground.

FIG. 2 shows another schematic diagram of an electronic circuit 102 that is substantially the same as electronic circuit 100 illustrated in FIG. 1 except that the input stage is maximally tilted by a differential input signal. The total amount of current ("2I") supplied by current source I40 is now flowing through only one input transistor Q40 to the turn around stage. Also, the amount of current flowing through output transistor Q41 is close to zero, while the amount of current flowing through output transistor Q31 is doubled from the at rest state ("2I" instead of "I"). The total amount of the output current ("2I") flowing through output transistor Q31 is substantially equal to the differential input current flowing through input transistor Q40.

There are some disadvantages to the operation of the electronic circuitry illustrated in FIGS. 1 and 2. For example, the need for high bias currents in output transistors Q30 and Q31 to accommodate the total current swing coming from the input stage, can cause an increase in the total supply current necessary to power the electronic circuit. In many cases, supply power is at a premium and this increase in power consumption is not desirable.

Additionally, because of the relatively high current ("2I") flowing through resistors R30 and R31, these resistors would have relatively small resistance values to prevent a relatively high voltage drop across the resistors. For example, if a relatively high voltage drop did occur across resistors R30 and R31, the common-mode input voltage range of the electronic circuit would be limited near ground because the relatively high voltage drop would force the input transistors Q40 and Q41 into saturation when their bases were pulled too low. However, relatively small resistance values for resistors R30 and R31 would cause a relatively high level of thermal current noise that would increase the total equivalent input noise voltage through the transconductance of the input stage.

Furthermore, current sources I31 and I32 are used to bias the collectors of the output transistors Q30 and Q31 and these current sources are typically implemented with active devices and resistors. In this case, relatively high currents provided by current sources I31 and I32 would require the use of degeneration resistors with relatively small resistance values that would further increase the input noise voltage in other circuits coupled to the electronic circuit shown in FIGS. 1 and 2. Also, high currents through resistors R30 and R31 increase the contributions of these resistors to the total input reference offset voltage. A relative mismatch between resistors R30 and R31 will, through the relatively high bias currents, translate into a relatively high voltage offset.

Another disadvantage of the electronic circuitry shown in FIGS. 1 and 2 is the biasing of the output transistors at a fixed voltage relative to ground by bias transistor Q33 and resistor R32. For example, when the current ("2I") supplied by tail current source I40 is doubled ("4I"), it is split into two currents ("2I") that flow into the collectors of the input transistors Q40 and Q41. Since both of these doubled currents flowing from the input transistors will be absorbed by resistors R30 and R31 (essentially behaving as fixed current sources), no net current will be left to flow through output transistors Q30 and Q31, which will cause the output transistors to shut off.

Additionally, variations in the amount of the tail current flowing through the input transistors can occur in rail-to-rail input stages which consist of two pairs of complementary input transistors: one of NPN type and one of the PNP type. The total tail current is usually steered towards the NPN or the PNP side, depending on the common mode input voltage. This current redirection causes the tail current of each individual input stage to vary between the total tail current and zero. Thus, the ground referenced bias of the electronic circuitry illustrated in FIGS. 1 and 2 creates a disadvantage when used with another circuit such as an amplifier that employs complementary rail-to-rail input stages.

Figure 3:
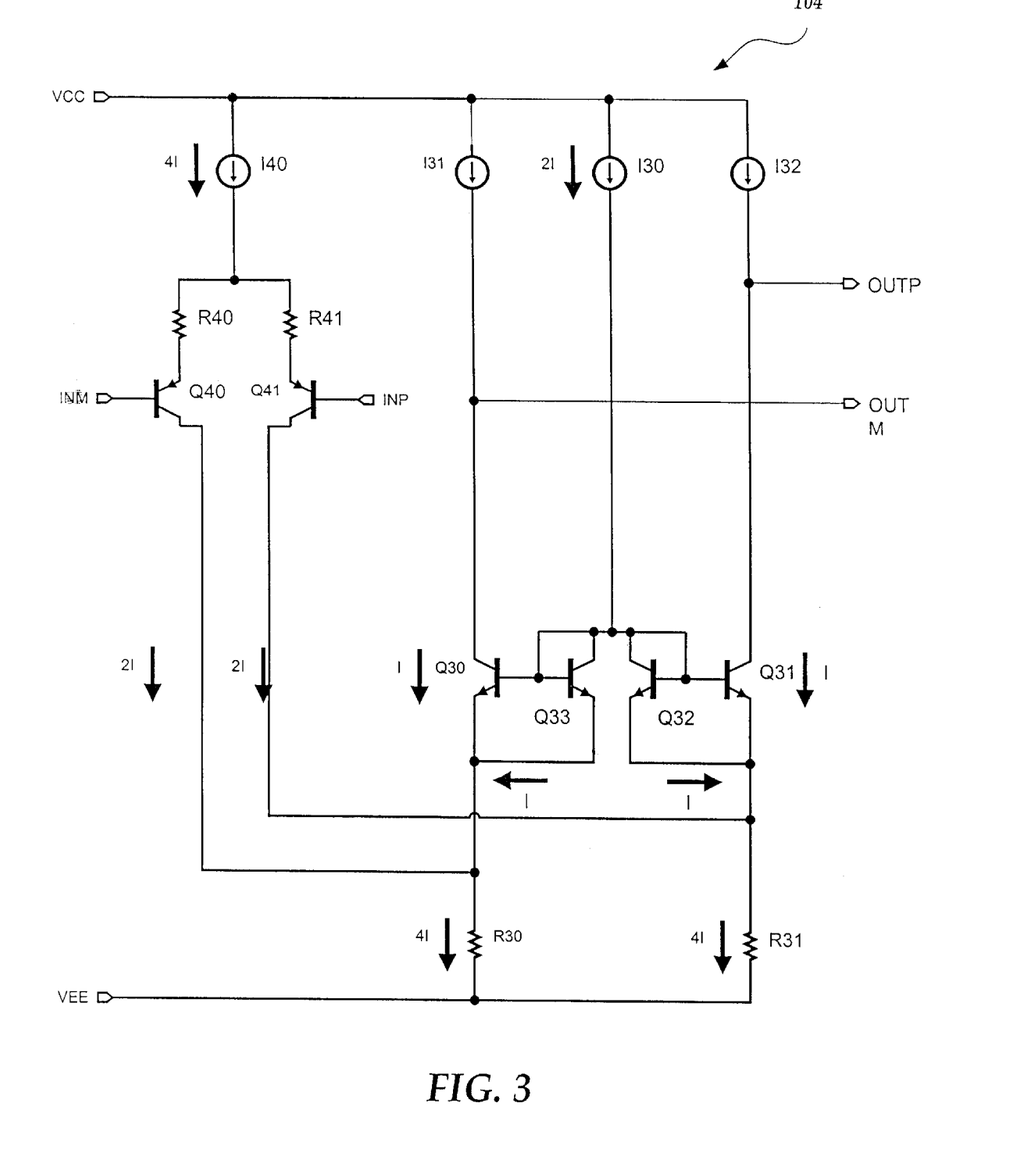
FIG. 3 illustrates a schematic diagram of an electronic circuit with a turn around stage that is referenced to a floating source.
Figure 4:
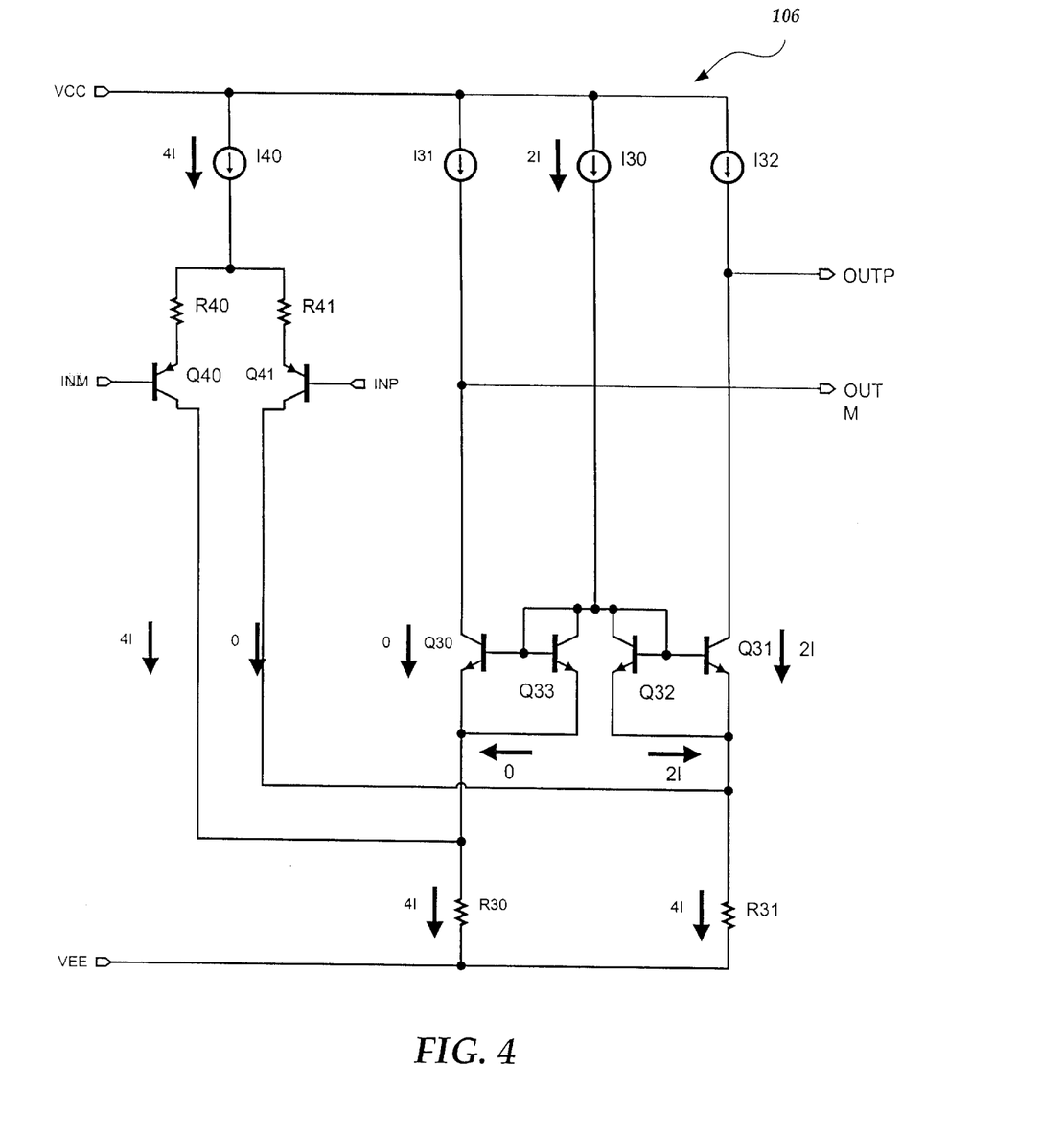
FIG. 4 shows another schematic diagram of the electronic circuit with the turn around stage that is referenced to a floating source.

FIGS. 3 and 4 illustrate electronic circuitry that floats the biasing of output transistors Q30 and Q31, which are arranged in a cascode configuration. FIG. 3 shows an electronic circuit 104 at rest where output transistors Q30 and Q31 are biased by a pair of diode connected bias transistors Q32 and Q33. Instead of referencing to ground, the biasing of output transistors Q30 and Q31 is now referenced to the common-mode voltage at the emitters of the output transistors. When the voltage across resistors R30 and R31 increases, for example because the total tail current provided by current source I40 is increased, the emitter voltages of the output transistors Q30 and Q31 go up, which in its turn causes the bases of the output transistors to go up as well. Since the bases of output transistors Q30 and Q31 follow their emitter voltages, this arrangement effectively fixes the base-emitter voltage of the output transistors and their collector currents.

The currents flowing through output transistors Q30 and Q31 are provided by bias current source I30. Under quiescent (at rest) conditions, the current supplied by bias current source I30 is split evenly between bias transistors Q32 and Q33. Also, because the base-emitter voltage of output transistor Q30 tracks the base-emitter voltage of bias transistor Q33 and the base-emitter voltage of output transistor Q31 tracks that of bias transistor Q32, the currents through each of the output transistors are equal to the current through the respective bias transistor, which is half the current provided by current source I30.

FIG. 4 illustrates an electronic circuit 106 in a maximally tilted mode of operation that is substantially the same as the electronic circuit shown in FIG. 3. The total tail current ("4I") of the current source I40 flows through input transistor Q40, while the current flowing through input device Q41 is close to zero. This one-sided current distribution causes an increase in the voltage at the emitter of output transistor Q30, while the emitter voltage of output transistor Q31 decreases. However, the common mode bias voltage at the bases of output Q30 and Q31 will remain constant. Also, as the base-emitter voltage of output transistor Q30 and biasing transistor Q33 decreases, their respective collector currents decrease. Thus, the total bias current ("2I") provided by current source I30 now flows through bias transistor Q32, as well as through output transistor Q31, since this output transistor copies the base-emitter voltage of bias transistor Q32.

It is significant that the embodiment of the turnaround stage illustrated in FIGS. 3 and 4 causes an attenuation of the differential input signal current by a factor of two. For example, the differential input signal current to the emitters of output transistors Q30 and Q31 is "4I", while the differential output signal current at the collector of active output transistor Q31 is only "2I". Thus, to generate the same differential output current as the circuit shown in FIGS. 1 and 2, the total tail current generated by current source I40 will have to be doubled, at the cost of increased power consumption by the circuitry shown in FIGS. 3 and 4.

Another disadvantage of the circuitry illustrated in FIGS. 3 and 4 is noise and reduced offset properties. The lack of degeneration of bias transistors Q32 and Q33 causes these devices to be a major contributor to the input referred noise and offset voltages of other circuits coupled to the circuitry. When the biasing transistors and the input transistors are biased at the same collector currents, the noise contribution of the biasing transistors is higher than that of the input transistors. Even when the currents through bias transistors Q32 and Q33 are half that of the currents flowing through the input transistors, as is the case in FIG. 3, the noise of the turn-around stage will typically dominate over the noise of the input stage. Additionally, the input referred offset voltage requires close matching of the bias transistors Q32 and Q33.

Any offset voltage between the bias transistors directly translates into an input referred offset voltage.

Although the electronic circuitry shown in FIGS. 3 and 4 may be used with rail-to-rail input stages because it fixes the ground-referenced biasing limitation of the circuitry illustrated in FIGS. 1 and 2, this solution comes at the price of increased power consumption, increased noise and reduced offset performance.

Figure 5:
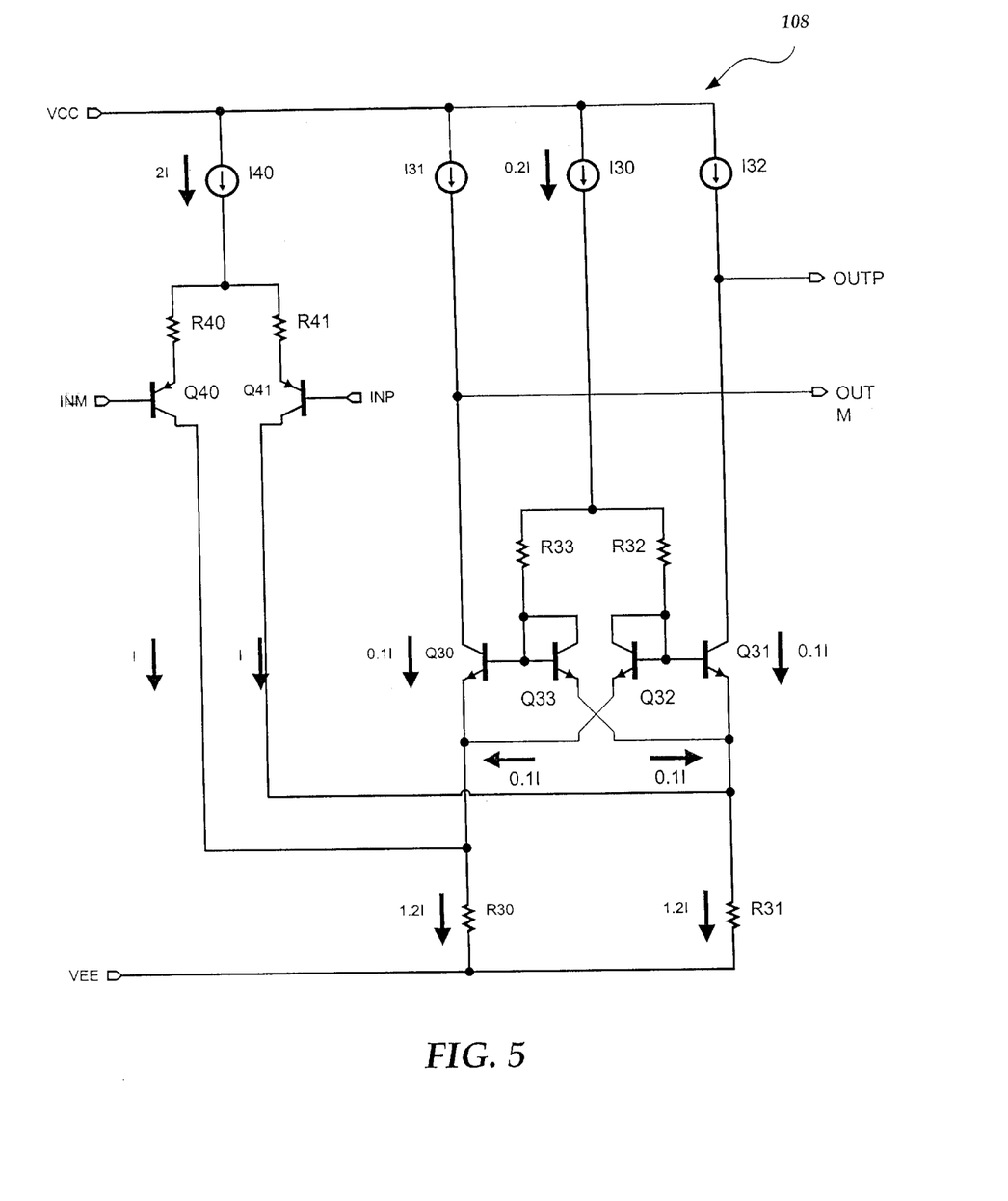
FIG. 5 illustrates a schematic diagram of an electronic circuit with a turn around stage that is referenced to a cross-coupled floating bias circuit.
Figure 6:
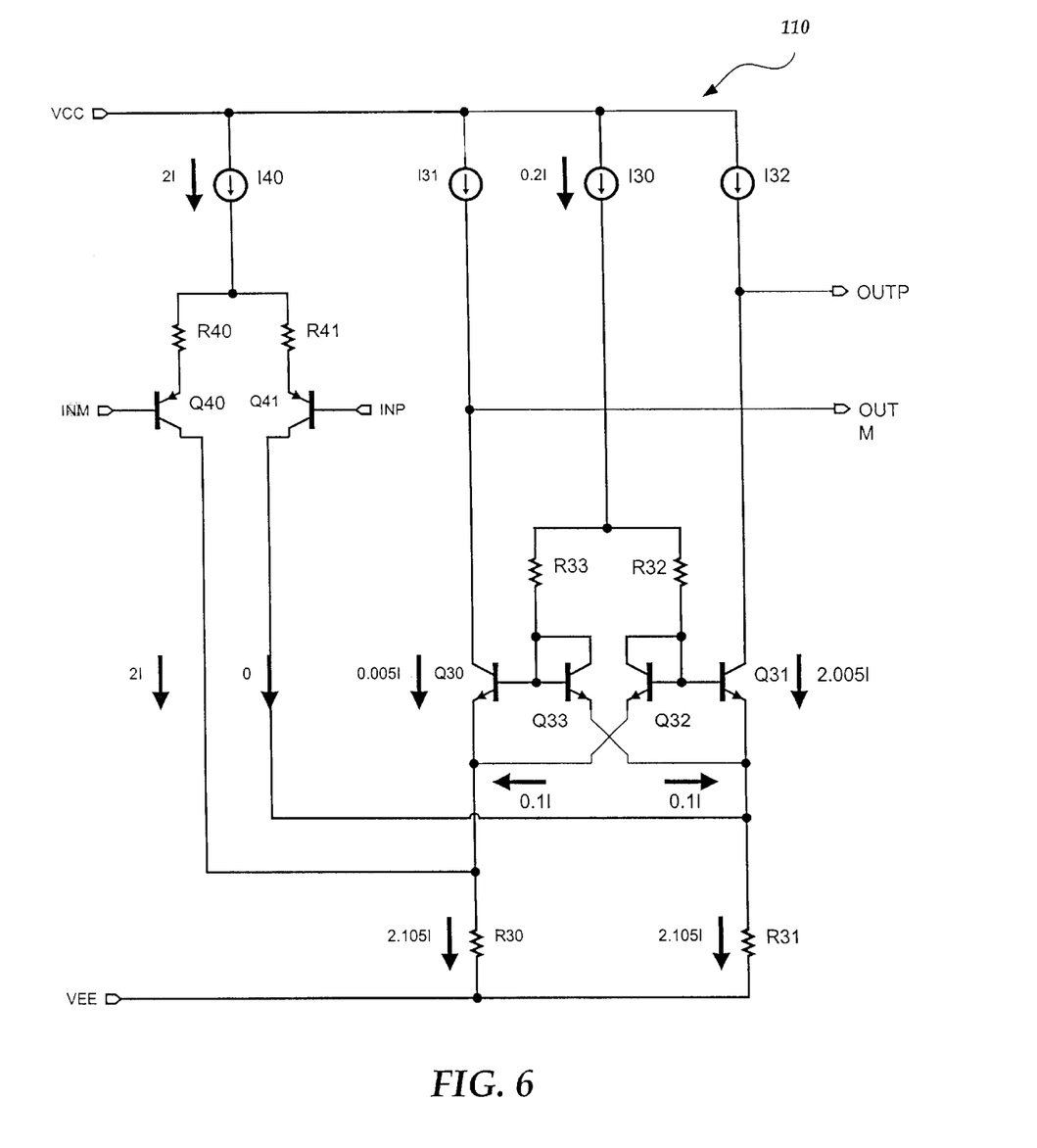
FIG. 6 shows another schematic diagram of the electronic circuit with the turn around stage that is referenced to the cross-coupled floating bias circuit.

FIGS. 5 and 6 illustrate a schematic diagram of an electronic circuit with an improved turn around stage that overcomes the limitations of the embodiments shown in FIGS. 1–4. FIG. 5 illustrates an electronic circuit 108 at rest, i.e., when a tilted differential input signal is not present at the input terminals coupled to the bases of input transistors Q40 and Q41. In this embodiment, the turn around stage provides a floating bias circuit and improved noise and offset performance for use with an input stage operating between the rails of a voltage supply. As shown in FIG. 5, the arrangement of devices in electronic circuit 108 differs from the electronic circuitry disclosed in FIGS. 1–4 in at least three aspects. First, the bases of the output transistors (Q30 and Q31) are not directly connected to each other. Second, the bias transistors (Q32 and Q33) are cross-coupled to the emitters of the opposite output transistors (Q30 and Q31). Third, the bias current supplied by bias current source I30 is evenly split by a pair of bias resistors R32 and R33 between the bias transistors (Q32 and Q33).

The electronic circuitry shown in FIGS. 5 and 6 provides Class-AB behavior that allows the turn around stage to be biased at a quiescent current that is significantly lower than the maximum differential output current, e.g., quiescent current of 1 milliamp and a maximum differential output current of 20 milliamps. Also, output transistors Q30 or Q31 are never "cut-off", even under relatively large input signal conditions. However, when the current flowing through one output transistor becomes very large, the other current flowing through the other output transistor will necessarily become very small since the product of the two currents is a constant value. For example, when the circuit is at rest and no tilted differential input signal is present, the currents flowing through output transistors Q30 and Q31 have relatively small values "0.1I"). This "at rest" bias current is approximately twenty times smaller than the maximum differential input signal current ("2I") set by current source I40.

FIG. 6 shows an electronic circuit 110 that is maximally tilted by a differential input signal (input transistor Q40 is active and input transistor Q41 is inactive) and substantially similar to the electronic circuitry illustrated in FIG. 5. The tail current ("2I") supplied by current source I40 is primarily flowing through input transistor Q40 to the turn around stage, and the amount of tail current flowing through input transistor Q41 is close to zero.

Because of the increase in current flow from input transistor Q40, the voltage across resistor R30 will increase. Through bias transistor Q32, which is biased at a fixed current ("0.2I") by current source I30, the voltage at the base of output transistor Q31 increases. At the same time, the emitter voltage of output transistor Q31 decreases, since the current flowing through resistor R31 drops. The resulting increase of the base-emitter voltage of output transistor Q31 causes it to turn on and conduct a current (2I ). Also, the current through output transistor Q30, on the opposite side of the turn around stage, is limited to a very small, but non-zero current ("0.005I"). The amount of output current ("2.005I") flowing through the active output transistor (Q31) in the turn around stage is approximately equal to the amount of current ("2I") flowing through active input transistor Q40.

The biasing of output transistors Q40 and Q41 in the turn around stage is floating, i.e., not referenced to ground. The floating bias of the output transistors makes the turn around stage well suited for use with other circuits that employ rail-to-rail input stages with varying tail currents. Also, the turn around stage disclosed in the circuitry illustrated in FIGS. 5 and 6 provides several advantages over other turn around stages disclosed in FIGS. 1–2. These advantages include reduced power consumption, less noise and improved offset performance.

Since the electronic circuitry illustrated in FIGS. 5 and 6 provide Class AB behavior, when at rest, this circuit operates at a reduced bias current and consumes substantially less power than when the circuit is driving a differential output signal. For example, the total bias current for the "at rest" circuit shown in FIG. 5 is "2.4I", while the total bias current for the circuit at rest in FIG. 1 is "4I". Also, when the "tilted" circuit shown in FIG. 6 is driving a differential output signal current ("2.005I"), the total bias current is "4.21I". In comparison, the circuit shown in FIG. 4 requires a total bias current of "8I" to drive substantially the same differential output signal current ("2I").

The reduced bias current levels of the electronic circuitry shown in FIGS. 5 and 6 lowers its contribution to the total input referred voltage noise of another circuit such as an amplifier that would employ this circuitry. Also, the collector shot noise of the bipolar output transistors is reduced proportionally because of the smaller bias currents, and the bias resistors contribute less noise, because they can have higher values for the same voltage drop.

The two bias resistors R32 and R33 illustrated in FIGS. 5 and 6 set up the biasing currents of bias transistors Q32 and Q33. These resistors serve to degenerate the diode connected bias transistors Q32 and Q33, and if the resistor value is relatively large enough, the noise contributions of these bias transistors to the input noise is further reduced to a negligible level. For example, the collector shot noise current of bias transistor Q32 (can be modeled by a noise current source between the emitter and collector of the bias transistor) will recycle within the bias transistor itself, without ever injecting into the circuit. For this condition to happen, bias resistors R32 and R33 must have a relatively much higher value than the emitter resistance of bias transistors Q32 and Q33. This condition can be satisfied in most cases, because of the large voltage headroom between the common collector-base terminals of bias transistors Q32 and Q33 and the positive rail of the supply voltage.

The input referred offset voltage also benefits from the reduced bias currents of the circuitry illustrated in FIGS. 5 and 6. These smaller bias currents reduce the voltage offset of resistors R30 and R31 for the same relative mismatch between the two resistors. Also, when the current splitting bias resistors R32 and R33 have a high enough resistance, offset voltages between bias transistors Q32 and Q33 become insignificant to the overall offset. Because of the relatively large resistance values of bias resistors R32 and R33, the accuracy of the splitting of the current provided by bias current source I30 is mostly set by the close matching of the value of the two bias resistors, and not as significantly determined by any base emitter voltage deviations between bias transistors Q32 and Q33.

The matching of the value of resistors in an integrated circuit process is typically more controllable than the matching between bipolar transistors. For example, resistor matching is often as accurate as 0.1%, while current matching of transistors usually is accurate to a couple of percent.

Figure 7:
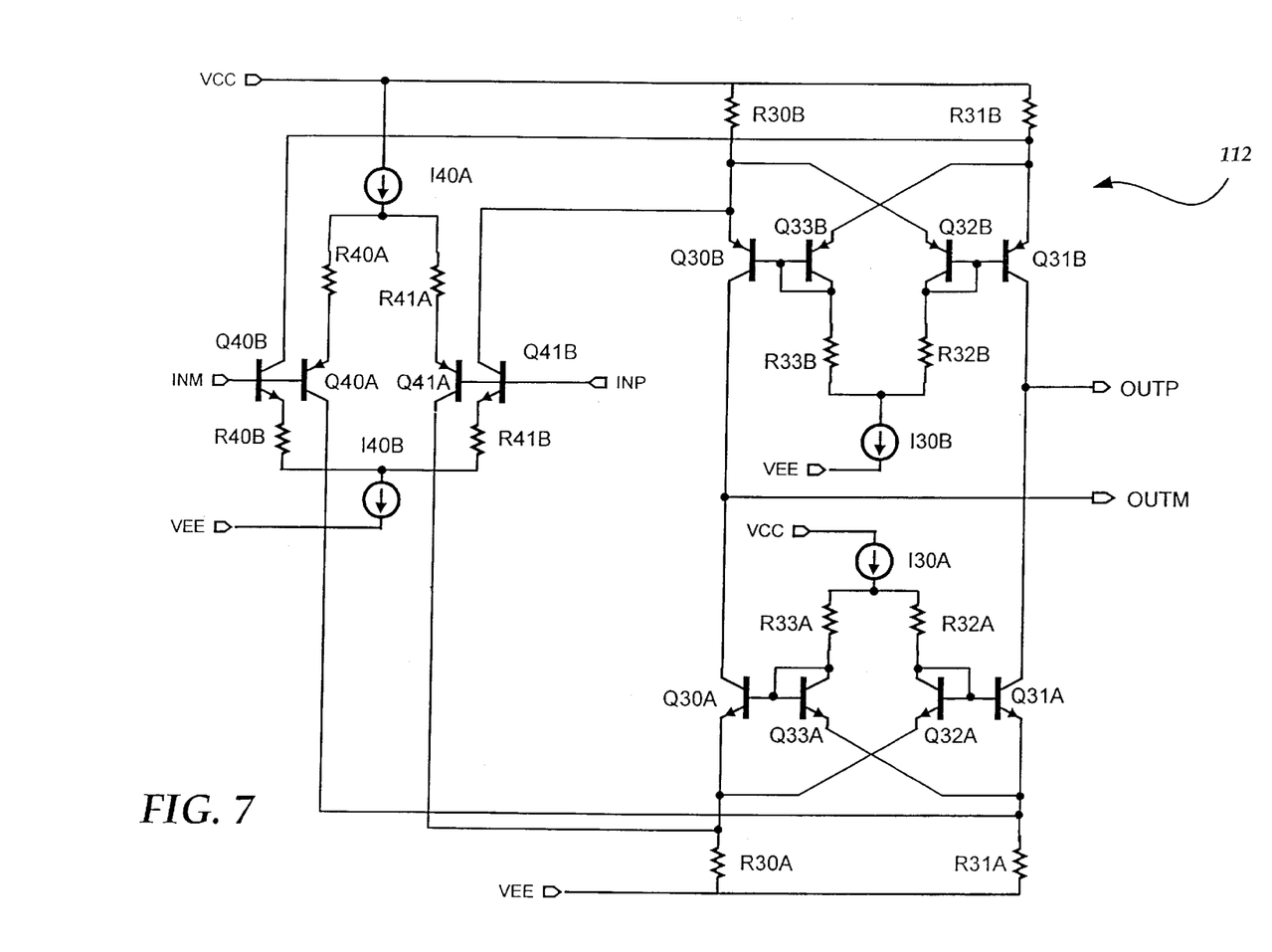
FIG. 7 illustrates a schematic diagram of an electronic circuit with a complementary input stage adapted for receiving a differential input signal with a common mode voltage that may be at, or between, the rails of a voltage supply and a pair of turn around stages that are referenced to cross-coupled floating bias circuits for combining the currents outputted by the complementary input stage.

FIG. 7 illustrates another electronic circuit 112 that operates between the two rails of a voltage supply. An input stage employs complementary pairs of bipolar input transistors (Q40A, Q40B and Q41A, Q41B) to receive a differential input signal with a common mode voltage that can be at, or between, the rails of the voltage supply. An input terminal INM is coupled to both of the bases of input transistors Q40A and Q40B and another input terminal INP is coupled to both of the bases of input terminals Q41A and Q41B.

The input stage shown in FIG. 7 operates in a way substantially similar to the other input stage illustrated in FIGS. 5 and 6. A current source I40A provides a tail current that flows through input resistors R40A and R41A to the PNP input transistors Q40A and Q41A; and a current source I40B sinks a current that flows through input resistors R40B and R41B and the NPN input transistors Q40B and Q41B from the positive rail of the voltage supply. This arrangement of complementary input transistor pairs enables the input stage to receive a differential input signal with a common mode voltage that is at, or between, the rails of the voltage supply.

A turn around stage is coupled at the collectors to both pairs of the complementary input transistors in the input stage. The turn around stage operates in a manner substantially similar to the operation of the other turn around stage shown in FIGS. 5 and 6. However, the turn around stage illustrated in FIG. 7 employs complementary arrangements of bipolar biasing and output transistors to enable the combination of the currents outputted by complementary pairs of transistors in the input stage. The bottom pairs of NPN output and diode connected biasing transistors Q30A, Q33A, Q32A and Q31A receive output currents from the PNP pair of transistors in the input stage. Similarly, the top pairs of PNP output and diode connected biasing transistors Q30B, Q33B, Q32B and Q31B receive output currents from the NPN pair of transistors in the input stage. Thus, a differential input signal with a common mode voltage at, or between, the rails of the voltage supply can be received by the input stage and currents outputted by the input stage can be combined in the turn around stage to produce an output signal across a pair of output terminals OUTP and OUTM.

Figure 8:
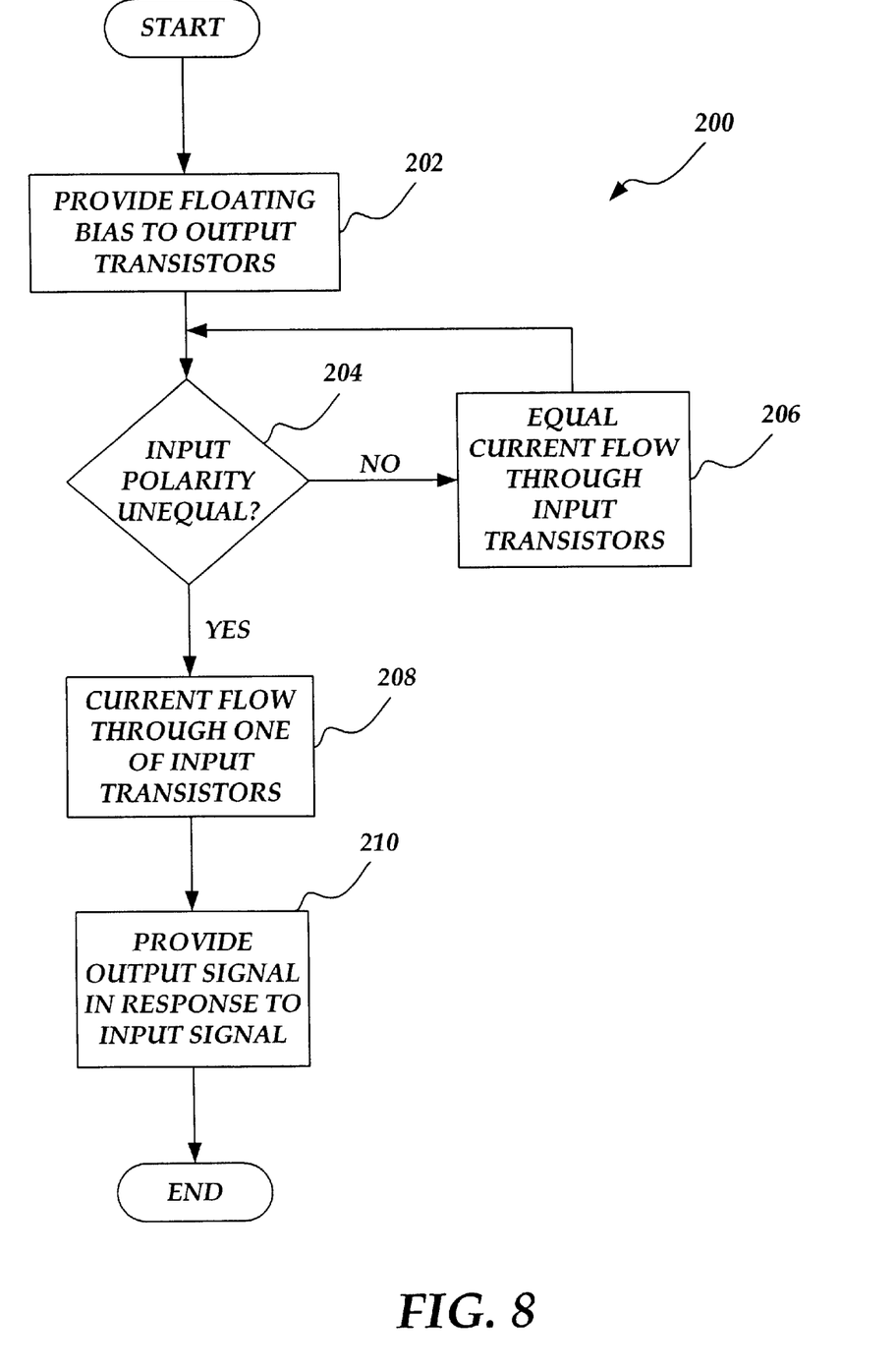
FIG. 8 shows a flow chart for providing an electronic circuit with an input common mode voltage range that is independent of the output voltage range.

FIG. 8 illustrates a flowchart 200 for providing electronic circuitry with an input common mode voltage range that is independent of the output common mode voltage range. Moving from a start block, the logic flows to a block 202 where a bias circuit separately provides a floating bias for a pair of output transistors that are adapted for outputting an output signal across their collectors. An emitter of a biasing transistor for one output transistor is cross-coupled to an emitter of the other output transistor. Similarly, an emitter of another biasing transistor for the opposite output transistor is cross-coupled to an emitter of the other output transistor. The cross coupling of the emitters of the biasing transistors helps to reduce noise and power consumption of the circuit.

The logic flows to a decision block 204 where the polarity of an input signal is determined. If the polarity of the input signal is equal, then the logic moves to a block 206 where a current provided by a first current source is evenly split between the emitters of a pair of input transistors. The logic loops back to decision block 204 to determine the polarity of the input signal.

Alternatively, when the polarity of the input signal is determined to be unequal at decision block 204, the logic advances to a block 208 where the current provided by the first current source will flow primarily through of one of the input transistors that has a polarity that matches an unequal polarity of the input signal. The logic transitions from block 208 to a block 210 where an output signal is outputted. Also, when a polarity of one of the output transistors is mismatched to the unequal polarity of the input signal, a relatively larger current will flow through the one of the output transistors with the mismatched polarity than another current flowing through the one of the output transistors with a polarity that matches the unequal polarity of the input signal. Next, the logic flow moves to an end block and returns to performing other operations.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for a circuit with an input voltage range that is independent of the output voltage range, comprising:
   (a) an input stage adapted for receiving an input signal, a current provided by a first current source flows substantially through one of a first switch and a second switch when one of the first and second switches is activated by an unequal polarity of the input signal and another of the first and second switches is deactivated by the unequal polarity of the input signal;
   (b) a turn around stage that outputs an output signal when the polarity of the input signal is unequal, the flow of the current through the one of the first and second switches that is activated causes one of a third switch and a fourth switch to be deactivated and the other one of the third and fourth switches to be activated and conduct an output current that is substantially larger than another current that flows through the one of the third and fourth switches that is deactivated; and
   (c) a bias circuit for separately providing a floating bias for the operation of the third and fourth switches, a fifth switch biases the operation of the third switch and an emitter of the fifth switch is cross coupled to an emitter of the fourth switch, a sixth switch biases the operation of the fourth switch and an emitter of the sixth switch is cross coupled to an emitter of the third switch, wherein the cross coupling of the emitters of the fifth and sixth switches reduces noise and power consumption of the circuit.

2. The apparatus of claim 1, further comprising:
   (a) a first resistor with an end that is coupled to a second current source and another end that is coupled to a base and a collector of the fifth switch; and
   (b) a second resistor with an end that is coupled to the second current source and another end that is coupled to a base and a collector of the sixth switch, a value of the first resistor and another value of the second resistor are matched, wherein a total current provided by the second current source is split evenly between a current that flows through the fifth switch and another current that flows through the sixth switch.

3. The apparatus of claim 1, wherein the larger current that flows through the one of the third and fourth switches that is activated is substantially equal to the current that flows through the one of the first and second switches that is activated by the unequal polarity of the input signal.

4. The apparatus of claim 1, wherein the circuit provides Class AB behavior.

5. The apparatus of claim 1, wherein the input stage is a complementary input stage that is operative to receive a differential input signal with a common mode voltage that is at, or between, either rail of a voltage supply and the turn around stage is arranged to combine each current outputted by the complementary input stage.

6. An apparatus for a circuit with an input voltage range that is independent of the output voltage range, comprising:

(a) an input stage adapted for receiving an input signal, a first current source is coupled to an emitter of a first transistor and an emitter of a second transistor, a current provided by the first current source is evenly split between the emitters of the first and second transistors when a polarity of the input signal is equal, and the current provided by the first current source flows through one of the first and second transistors when one of the first and second transistors is activated by an unequal polarity of the input signal and the other of the first and second transistors is deactivated by the unequal polarity of the input signal;

(b) a turn around stage that outputs an output signal when the polarity of the input signal is unequal, a second current source is coupled to a collector of a third transistor and a third current source is coupled to a collector of a fourth transistor, the flow of the current through the one of the first and second transistors that is activated causes one of the third and fourth transistors to be deactivated and another one of the third and fourth transistors to be activated and conduct an output current from one of the second and third current sources that is substantially larger than another current that flows through the other one of the third and fourth transistors that is deactivated; and (c) a bias circuit for separately providing a floating bias for the operation of the third and fourth transistors, a base and a collector of a fifth transistor is coupled to a base of the third transistor and a fourth current source and an emitter of the fifth transistor is cross coupled to an emitter of the fourth transistor, a base and a collector of a sixth transistor is coupled to a base of the fourth transistor and the fourth current source and an emitter of the sixth transistor is cross coupled to an emitter of the third transistor, wherein the cross coupling of the emitters of the fifth and sixth transistors reduces noise and power consumption of the circuit.

7. The apparatus of claim 6, further comprising:

(a) a first resistor that is coupled between the fourth current source and the base and the collector of the fifth transistor; and (b) a second resistor that is coupled between the fourth current source and the base and the collector of the sixth transistor, a value of the first resistor and another value of the second transistor are matched, wherein a total current provided by the fourth current source is split evenly between a current that flows through the fifth transistor and another current that flows through the sixth transistor.

8. The apparatus of claim 7, wherein a difference in the value of the first resistor and the other value of the second transistor is less than a tenth of a percent.

9. The apparatus of claim 6, wherein the first and second transistors are PNP bipolar transistors, the third and fourth transistors are NPN bipolar transistors and the fifth and sixth transistors are NPN bipolar transistors.

10. The apparatus of claim 6, wherein each current flowing through the fifth and sixth transistors are equal and constant both when the polarity of the input signal is equal and when the polarity of the input signal is unequal.

11. The apparatus of claim 6, further comprising:

(a) a third resistor with one end coupled to a negative rail of a voltage supply and another end coupled to the collector of the first transistor, the emitter of the third transistor and the emitter of the fifth transistor; and (b) a fourth resistor with one end coupled to the negative rail of the voltage supply and another end coupled to the collector of the first transistor, the emitter of the fourth transistor and the emitter of the sixth transistor, wherein a current flowing through the third resistor matches another current flowing through the fourth resistor.

12. The apparatus of claim 6, further comprising:

(a) a fifth resistor with one end coupled to the first current source and another end coupled to the emitter of the first transistor; and (b) a sixth resistor with one end coupled the first current source and another end coupled to the emitter of the second transistor.

13. The apparatus of claim 6, wherein the output current that flows through the one of the third and fourth transistors that is activated is substantially equal to the current that flows through the one of the first and second transistors that is activated by the unequal polarity of the input signal.

14. The apparatus of claim 6, wherein the first, second, third and fourth current sources are coupled to a positive rail of a voltage supply.

15. The apparatus of claim 6, wherein the first, second, third and fourth current sources include at least one resistor and at least one transistor.

16. The apparatus of claim 6, wherein the circuit provides Class AB behavior.

17. The apparatus of claim 6, wherein the input signal is received across a base of the first transistor and a base of the second transistor.

18. The apparatus of claim 6, wherein the output signal is provided across the collectors of the third and fourth transistors.

19. The apparatus of claim 6, wherein the input stage is a complementary input stage that is operative to receive a differential input signal with a common mode voltage that is at, or between, either rail of a voltage supply and the turn around stage is arranged to combine each current outputted by the complementary input stage.

20. An apparatus for a circuit with an input voltage range that is independent of the output voltage range, comprising:

(a) means for receiving an input signal, a current provided by a first current source flows substantially through one of a first switch and a second switch when a polarity of one of the first and second switches is activated by an unequal polarity of the input signal and the other one of the first and second switches is deactivated by the unequal polarity of the input signal;

(b) means for outputting an output signal when the polarity of the input signal is unequal, the flow of the current through the one of the first and second switches that is activated causes one of a third switch and a fourth switch to be deactivated and the other one of the third and fourth switches to be activated and conduct an output current that is substantially larger than another current that flows through the one of the third and fourth switches that is deactivated; and (c) means for separately providing a floating bias for the operation of the third and fourth switches, a fifth switch biases the operation of the third switch and an emitter of the fifth switch is cross coupled to an emitter of the fourth switch, a sixth switch biases the operation of the fourth switch and an emitter of the sixth switch is cross coupled to an emitter of the third switch, wherein the cross coupling of the emitters of the fifth and sixth switches reduces noise and power consumption of the circuit.

21. A method for providing an input voltage range that is independent of the output voltage range in a circuit, comprising:

(a) receiving an input signal, a current provided by a first current source flows substantially through one of a first switch and a second switch when a polarity of one of the first and second switches matches an unequal polarity of the input signal;

(b) outputting an output signal when the polarity of the input signal is unequal, the flow of the current through the one of the first and second switches that is activated causes one of a third switch and a fourth switch to be deactivated and the other one of the third and fourth switches to be activated and conduct an output current that is substantially larger than another current that flows through the one of the third and fourth switches that is deactivated; and (c) separately providing a floating bias for the operation of the third and fourth switches, a fifth switch biases the operation of the third switch and an emitter of the fifth switch is cross coupled to an emitter of the fourth switch, a sixth switch biases the operation of the fourth switch and an emitter of the sixth switch is cross coupled to an emitter of the third switch, wherein the cross coupling of the emitters of the fifth and sixth switches reduces noise and power consumption of the circuit.

* * * * *

UNITED STATES PATENT AND TRADEMARK OFFICE
CERTIFICATE OF CORRECTION

PATENT NO. : 6,313,667 B1  Page 1 of 1
DATED : November 6, 2001
INVENTOR(S) : Eschauzier It is certified that error appears in the above-identified patent and that said Letters Patent is hereby corrected as shown below:

Column 11,
Line 67, "are" should read -- is --

Column 12,
Line 20, "coupled" should read -- coupled to --

Signed and Sealed this

Fourteenth Day of May, 2002

*Attest:*

JAMES E. ROGAN
*Attesting Officer*  *Director of the United States Patent and Trademark Office*